(12) United States Patent
Chen et al.

(10) Patent No.: US 12,308,065 B2
(45) Date of Patent: May 20, 2025

(54) ADDRESS REFRESH CIRCUIT AND METHOD, MEMORY, AND ELECTRONIC DEVICE

(71) Applicant: CHANGXIN MEMORY TECHNOLOGIES, INC., Hefei (CN)

(72) Inventors: Jixing Chen, Hefei (CN); Enpeng Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 521 days.

(21) Appl. No.: 17/855,841

(22) Filed: Jul. 1, 2022

(65) Prior Publication Data

US 2023/0178135 A1 Jun. 8, 2023

Related U.S. Application Data

(63) Continuation of application No. PCT/CN2022/072027, filed on Jan. 14, 2022.

(30) Foreign Application Priority Data

Dec. 6, 2021 (CN) .......................... 202111476366.2

(51) Int. Cl.
*G11C 11/406* (2006.01)
*G11C 11/408* (2006.01)

(52) U.S. Cl.
CPC ........ *G11C 11/406* (2013.01); *G11C 11/4087* (2013.01)

(58) Field of Classification Search
CPC .......................... G11C 11/406; G11C 11/4087

USPC ......................................................... 365/149
See application file for complete search history.

(56) References Cited

U.S. PATENT DOCUMENTS

| 9,805,782 | B1 | 10/2017 | Liou |
| 10,490,250 | B1 | 11/2019 | Ito |
| 2005/0041506 | A1 | 2/2005 | Hwang et al. |
| 2015/0063049 | A1 | 3/2015 | Yang |

(Continued)

FOREIGN PATENT DOCUMENTS

| CN | 104425003 A | 3/2015 |
| CN | 207489475 U | 6/2018 |

(Continued)

OTHER PUBLICATIONS

Extended European search report in application No. 22902593, mailed on Sep. 4, 2024.

*Primary Examiner* — Connie C Yoha
(74) *Attorney, Agent, or Firm* — Syncoda LLC; Feng Ma

(57) ABSTRACT

An address refresh circuit and method, a memory, and an electronic device are provided. The address refresh circuit includes a selection circuit and a decoding circuit. The selection circuit is configured to acquire a strobe signal, a redundancy address signal and a normal address signal, and select, within each of a first pulse duration and a second pulse duration and based on the strobe signal, one of the redundancy address signal or the normal address signal as a target address signal; the first pulse duration and the second pulse duration belong to the same refresh cycle, and the second pulse duration is later than the first pulse duration. The decoding circuit is configured to decode the target address signal to obtain and output a decoded signal.

17 Claims, 15 Drawing Sheets

(56) References Cited

U.S. PATENT DOCUMENTS

| | | | |
|---|---|---|---|
| 2015/0279442 A1* | 10/2015 | Hwang | G06F 7/02 |
| | | | 365/222 |
| 2016/0005452 A1 | 1/2016 | Bae et al. | |
| 2017/0352400 A1 | 12/2017 | Kim | |
| 2020/0058346 A1 | 2/2020 | Ito et al. | |
| 2024/0127880 A1* | 4/2024 | Liu | G11C 11/406 |

FOREIGN PATENT DOCUMENTS

| | | |
|---|---|---|
| CN | 110827884 A | 2/2020 |
| JP | H11250694 A | 9/1999 |

* cited by examiner

ADDRESS REFRESH CIRCUIT AND METHOD, MEMORY, AND ELECTRONIC DEVICE

CROSS-REFERENCE TO RELATED APPLICATIONS

This application is a continuation of PCT International Application No. PCT/CN2022/072027, filed on Jan. 14, 2022, which is based on and claims priority to Chinese Patent Application No. 202111476366.2, filed on Dec. 6, 2021. The entire contents of PCT International Application No. PCT/CN2022/072027 and Chinese Patent Application No. 202111476366.2 are hereby incorporated herein by reference in their entireties.

BACKGROUND

With the rapid development of capacities and speeds of semiconductor memory devices widely used in electronic devices, power consumption of the semiconductor memory devices has been increasing.

The Dynamic Random Access Memory (DRAM) is a volatile semiconductor memory device that stores data by using charges stored in capacitors. Since the charges stored in the capacitors may leak in various ways over time, the DRAM has a characteristic of limited data retention. In order to solve the limited data retention, the DRAM usually needs to be refreshed periodically based on the data stored in the DRAM, to charge or discharge the capacitors.

SUMMARY

The disclosure relates to the field of integrated circuits, and the embodiments of the disclosure provide an address refresh circuit and method, a memory, and an electronic device.

In a first aspect, an embodiment of the disclosure provides an address refresh circuit, including a selection circuit and a decoding circuit. The selection circuit is configured to acquire a strobe signal, a redundancy address signal and a normal address signal; and select, within each of a first pulse duration and a second pulse duration and based on the strobe signal, one of the redundancy address signal or the normal address signal as a target address signal. The first pulse duration and the second pulse duration belong to the same refresh cycle, and the second pulse duration is later than the first pulse duration. The decoding circuit is configured to decode the target address signal to obtain and output a decoded signal.

In a second aspect, an embodiment of the disclosure provides an address refresh method, including the following operations. A strobe signal, a redundancy address signal and a normal address signal are acquired respectively. One of the redundancy address signal or the normal address signal is selected as a target address signal, within each of a first pulse duration and a second pulse duration and based on the strobe signal. The first pulse duration and the second pulse duration belong to the same refresh cycle, and the second pulse duration is later than the first pulse duration. The target address signal is decoded to obtain and output a decoded signal.

In a third aspect, an embodiment of the disclosure provides a memory, including the address refresh circuit in the first aspect.

In a fourth aspect, an embodiment of the disclosure provides an electronic device, including the memory in the third aspect.

DETAILED DESCRIPTION

In order to make the objective, technical solutions and advantages of the disclosure clearer, the technical solutions of the disclosure are further described in detail below with reference to the accompanying drawings and embodiments. The described embodiments shall not be construed as limitation of the disclosure. All other embodiments obtained by those of ordinary skill in the art without paying any creative work shall fall within the scope of protection of the disclosure.

In the following descriptions, reference is made to "some embodiments" which describe a subset of all possible embodiments. However, it should be understood that "some embodiments" may be the same or different subsets of all possible embodiments and may be combined with each other without conflict.

If "first/second" or a similar description appears in the disclosure, the following explanations are added. In the following descriptions, the term "first/second/third" involved is intended only to distinguish similar objects and does not represent a specific order for the objects. It should be understood that "first/second/third" may be interchanged in a specific order or sequence where allowed, so that the embodiments of the disclosure described here may be implemented in an order other than those illustrated or described here.

Unless otherwise defined, all technical and scientific terms used here have the same meaning as usually understood by one of ordinary skilled in the technical field to which the disclosure belongs to. The terms used here are intended to describe the embodiments of the disclosure only, and are not intended to limit the disclosure.

When a DRAM performs a refresh operation, the DRAM may refresh several word lines (WLs) simultaneously at a time. For example, if R15, R15B, R14 and R14B in a decoding circuit are all set to be 1 simultaneously, four WLs may be refreshed simultaneously at a time. There may be normal addresses and redundancy addresses in these WLs, that is, some of the addresses in the WLs are replaced with the redundancy addresses.

In some embodiments, the normal address and the redundancy address are usually refreshed separately, which requires additional refresh commands (CMDs), thereby occupying bandwidth resources and losing cell retention time; or, the normal address and the redundancy address are refreshed together, so that the normal address and the redundancy address are required to be decoded separately, which increases the area of the chip and is not beneficial to improve the integration of the chip.

Figure 1:
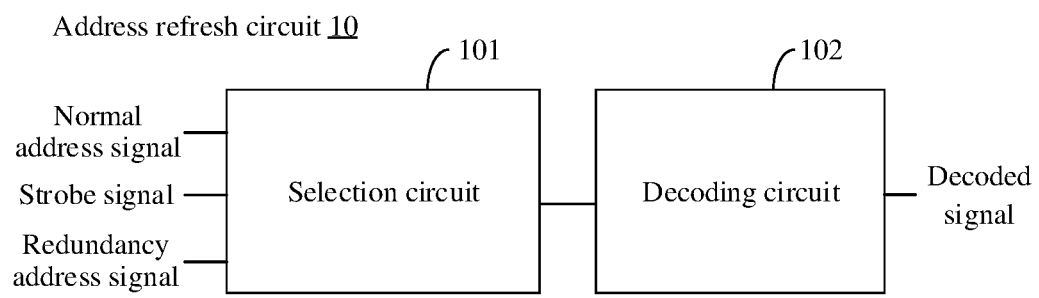
FIG. 1 is a first schematic structural diagram of an address refresh circuit according to an embodiment of the disclosure.

FIG. 1 is a schematic structural diagram of an address refresh circuit according to an embodiment of the disclosure. As shown in FIG. 1, the embodiment of the disclosure provides an address refresh circuit 10, including a selection circuit 101 and a decoding circuit 102.

The selection circuit 101 is configured to acquire a strobe signal, a redundancy address signal and a normal address signal, and select, within each of a first pulse duration and a second pulse duration and based on the strobe signal, one of the redundancy address signal or the normal address signal as a target address signal; the first pulse duration and the second pulse duration belong to the same refresh cycle, and the second pulse duration is later than the first pulse duration.

The decoding circuit 102 is configured to decode the target address signal to obtain and output a decoded signal.

In the embodiment of the disclosure, the redundancy address signal may correspond to Redundancy Row Address (referred to as RedRa), the normal address signal may correspond to Normal Row Address (referred to as Ra), and the strobe signal may be represented as Redundancy Enable (referred to as RedEn).

Figure 2:
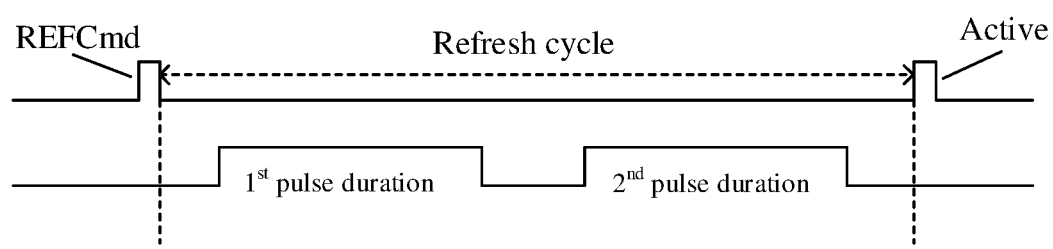
FIG. 2 is a schematic analysis diagram of an address refresh circuit according to an embodiment of the disclosure.

In the embodiment of the disclosure, as shown in FIG. 2, there is a refresh cycle between a refresh command (REFCmd) and an active command (Active), and WL address refresh needs to be completed within the refresh cycle. The first pulse ($1^{st}$ pulse) duration and the second pulse ($2^{nd}$ pulse) duration belong to the same refresh cycle, and the second pulse duration is later than the first pulse duration. The pulse duration characterizes a refresh state, and the address refresh may be performed once correspondingly within the pulse duration.

In the embodiment of the disclosure, Ra and RedRa may share a set of circuits called the address refresh circuit 10, and both the normal address signal and the redundancy address signal are input to the selection circuit 101. When all the row addresses are Ra within a refresh cycle, the selection circuit 101 is configured to select the normal address signal as the target address signal within each of the first pulse duration and the second pulse duration, that is, perform refresh of Ra within the refresh cycle. When all the row addresses are RedRa within a refresh cycle, the selection circuit 101 is configured to select the redundancy address signal as the target address signal within each of the first pulse duration and the second pulse duration, that is, perform refresh of RedRa within the refresh cycle. When both RedRa and Ra are present within a refresh cycle, the selection circuit 101 is configured to select the redundancy address signal as the target address signal within one pulse duration and select the normal address signal as the target address signal within another pulse duration, that is, perform both refresh of Ra and refresh of RedRa within the refresh cycle.

It should be noted that in an embodiment of the disclosure, the refresh cycle may further include more pulse durations (e.g., a third pulse duration). Correspondingly, the selection circuit 101 is configured to select one of the redundancy address signal or the normal address signal as the target address signal, within the third pulse duration and based on the strobe signal. If only two pulse durations are included within a refresh cycle, a corresponding refresh mode is referred to as two pulse refresh; and if more than two pulse durations are included within a refresh cycle, a corresponding refresh mode is referred to as multi-pulse refresh.

It should be understood that the address refresh circuit 10 may select, within each of the first pulse duration and the second pulse duration and based on the strobe signal, one of the redundancy address signal or the normal address signal as the target address signal for decoding. The first pulse duration and the second pulse duration belong to the same refresh cycle, and address refresh may be performed once within each pulse duration, therefore, the address refresh circuit 10 may complete refresh of Ra and refresh of RedRa within the same refresh cycle, that is, the refresh of two types of row addresses is completed through a set of circuits, thereby saving consumption and improving performance.

Figure 3:
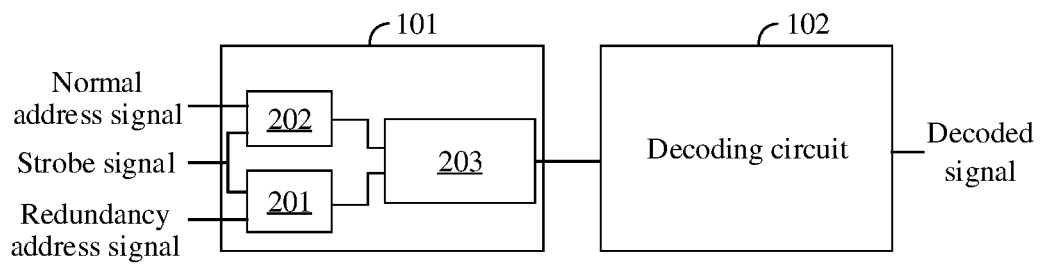
FIG. 3 is a second schematic structural diagram of an address refresh circuit according to an embodiment of the disclosure.

In some embodiments of the disclosure, as shown in FIG. 3, the selection circuit 101 includes a first selection circuit 201, a second selection circuit 202 and a third selection circuit 203. The first selection circuit 201 is configured to receive the redundancy address signal and the strobe signal, and output, in response to the strobe signal being at a first level, the redundancy address signal. The second selection circuit 202 is configured to receive the normal address signal and the strobe signal, and output, in response to the strobe signal being at a second level, the normal address signal. The third selection circuit 203 has input terminals connected to an output terminal of the first selection circuit 201 and an output terminal of the second selection circuit 202, respectively; and has an output terminal connected to an input terminal of the decoding circuit 102.

In the embodiment of the disclosure, a high level characterizes logical 1, a low level characterizes logical 0, and each of the first level and the second level is the high level or the low level. Specifically, if the first level is the high level, the second level is the low level; if the first level is the low level, the second level is the high level.

In the embodiment of the disclosure, when all the row addresses are Ra within a refresh cycle, the strobe signal is at the second level within each of the first pulse duration and the second pulse duration. Therefore, the selection circuit 101 is configured to select the normal address signal as the target address signal within each of the first pulse duration and the second pulse duration, that is, perform refresh of Ra within the refresh cycle. When all the row addresses are RedRa within a refresh cycle, the strobe signal is at the first level within each of the first pulse duration and the second pulse duration. Therefore, the selection circuit 101 is configured to select the redundancy address signal as the target address signal within each of the first pulse duration and the second pulse duration, that is, perform refresh of RedRa within the refresh cycle. When both RedRa and Ra are present within a refresh cycle, the strobe signal is at the first level within one pulse duration and is at the second level within another pulse duration, for example, the strobe signal is at the first level within the first pulse duration and is at the second level within the second pulse duration. At this time, the selection circuit 101 is configured to select the redundancy address signal as the target address signal within the first pulse duration and select the normal address signal as the target address signal within the second pulse duration, that is, perform both refresh of Ra and refresh of RedRa within the refresh cycle.

It should be understood that the first selection circuit 201 is configured to output the redundancy address signal based on the first level of the strobe signal, and the second selection circuit 202 is configured to output the normal address signal based on the second level of the strobe signal. That is, the selection circuit 101 is configured to output a corresponding address signal based on a level state of the strobe signal. Therefore, one of the redundancy address signal or the normal address signal may be output within each pulse duration to complete refresh, so that refresh of the redundancy address signal and refresh of the normal address signal may be completed within the refresh cycle including the first pulse duration and the second pulse duration, respectively, i.e., unified processing of the normal address and the redundancy address is completed, thereby saving consumption and improving performance.

Figure 4:
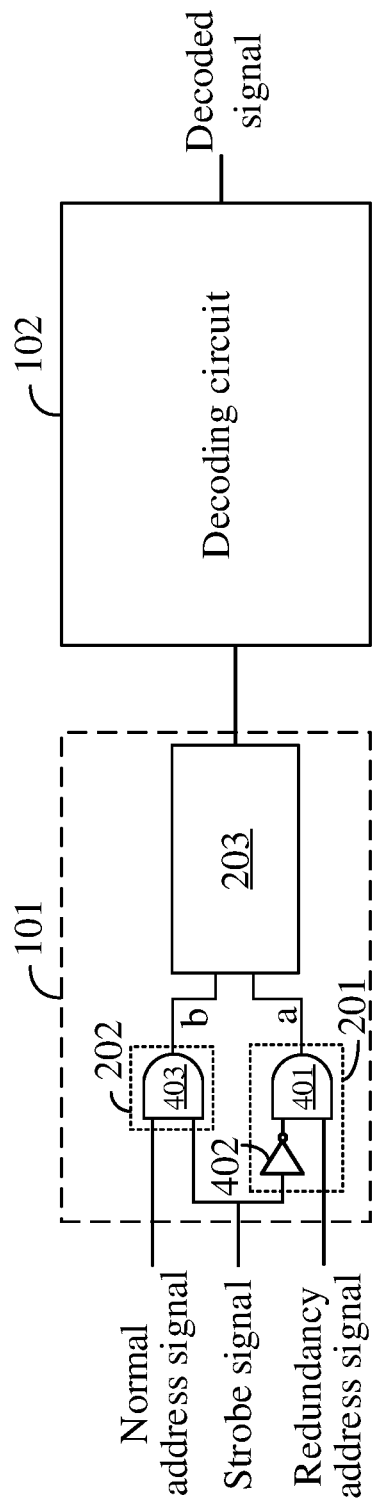
FIG. 4 is a third schematic structural diagram of an address refresh circuit according to an embodiment of the disclosure.

In some embodiments of the disclosure, as shown in FIG. 4, the first selection circuit 201 includes a first AND gate 401 and a first inverter 402. The first AND gate 401 has a first input terminal connected to an output terminal of the first inverter 402, and a second input terminal for receiving the redundancy address signal; and the first inverter 402 has an input terminal for receiving the strobe signal. The second selection circuit 202 includes a second AND gate 403 configured to receive the normal address signal and the strobe signal. The input terminals of the third selection circuit 203 are connected to an output terminal of the first AND gate 401 and an output terminal of the second AND gate 403, respectively, and the output terminal of the third selection circuit 203 is connected to the input terminal of the decoding circuit 102.

In the embodiment of the disclosure, the first level of the strobe signal is a low level, i.e., logical 0; and the second level of the strobe signal is a high level, i.e., logical 1. If the strobe signal is at logical 0, the first inverter 402 is configured to invert logical 0 of the strobe signal into logical 1, and the first AND gate 401 is configured to perform an AND operation on logical 1 and the redundancy address signal, to obtain a first intermediate signal 'a' characterized as the redundancy address signal; and the second AND gate 403 is configured to perform an AND operation on logical 0 of the strobe signal and the normal address signal, to obtain a second intermediate signal 'b' set to logical 0, that is, to mask the normal address signal. If the strobe signal is at logical 1, the first inverter 402 is configured to invert logical 1 of the strobe signal into logical 0, and the first AND gate 401 is configured to perform an AND operation on logical 0 and the redundancy address signal, to obtain a first intermediate signal 'a' set to logical 0, that is, to mask the redundancy address signal; and the second AND gate 403 is configured to perform an AND operation on logical 1 of the strobe signal and the normal address signal, to obtain a second intermediate signal 'b' characterized as the normal address signal.

In an embodiment of the disclosure, the second AND gate 403 has an input terminal for receiving other signals to adjust an output result of the second AND gate 403.

It should be noted that the output terminal of the first inverter 402 may be switched to be connected to an input terminal of the second AND gate 403. At this time, the normal address signal is output if the strobe signal is at logical 0, and the redundancy address signal is output if the strobe signal is at logical 1. On the other hand, each of the first AND gate 401 and the second AND gate 403 may be replaced with an OR gate. All of the above transformations shall fall within the scope of protection of the disclosure.

It should be understood that with the first AND gate 401, the first inverter 402 and the second AND gate 403, the normal address signal may be masked and the redundancy address signal may be output when the strobe signal is at logical 0; and the redundancy address signal is masked and the normal address signal is output when the strobe signal is at logical 0. Therefore, it is achieved that a corresponding address signal is output based on the level state of the strobe signal, so that refresh of the redundancy address signal and refresh of the normal address signal may be completed within the refresh cycle including the first pulse duration and the second pulse duration, respectively, thereby saving consumption and improving performance.

Figure 5:
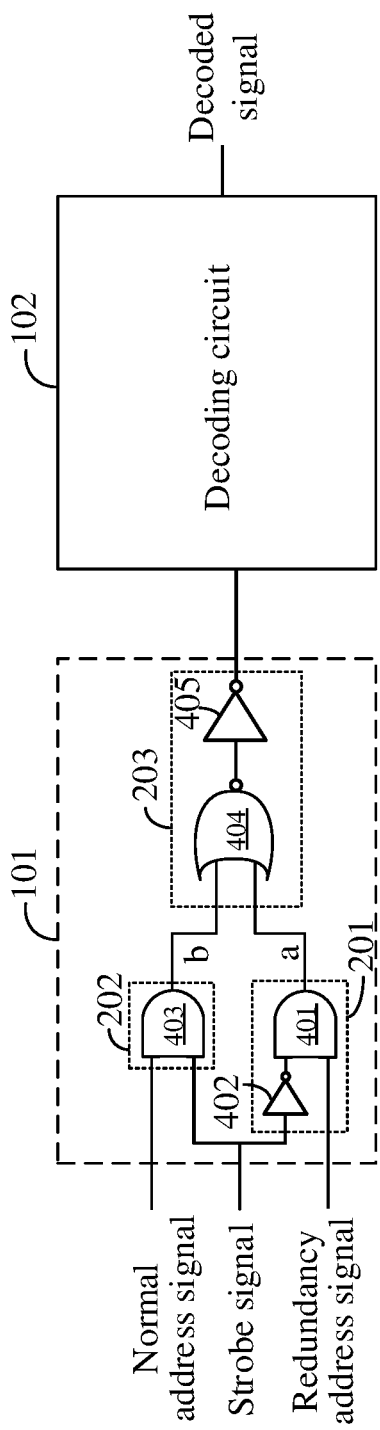
FIG. 5 is a fourth schematic structural diagram of an address refresh circuit according to an embodiment of the disclosure.

In some embodiments of the disclosure, as shown in FIG. 5, the third selection circuit 203 includes a NOT-OR (NOR) gate 404 and a second inverter 405. The NOR gate 404 has an output terminal connected to an input terminal of the second inverter 405, and input terminals taken as the input terminals of the third selection circuit 203; and the second inverter 405 has an output terminal taken as the output terminal of the third selection circuit 203.

In the embodiment of the disclosure, if the strobe signal is at logical 0, the first intermediate signal 'a' is characterized as the redundancy address signal, and the second intermediate signal 'b' is set to logical 0, that is, the normal address signal is masked. At this time, the NOR gate 404 and the second inverter 405 are configured to perform an OR operation on the first intermediate signal 'a' and the second intermediate signal 'b', to obtain and output the redundancy address signal as the target address signal.

If the strobe signal is at logical 1, the first intermediate signal 'a' is set to logical 0, that is, the redundancy address signal is masked, and the second intermediate signal 'b' is characterized as the normal address signal. At this time, the NOR gate 404 and the second inverter 405 are configured to perform an OR operation on the first intermediate signal 'a' and the second intermediate signal 'b', to obtain and output the normal address signal as the target address signal.

In the embodiment of the disclosure, the second inverter 405 may be configured to drive the output target address signal, to reduce attenuation of the target address signal during transmission.

It should be noted that if each of the first AND gate 401 and the second AND gate 403 is replaced with an OR gate, the NOR gate 404 is required to be replaced with a NOT-AND (NAND) gate correspondingly, and the circuit after such replacement may still select, based on the level state of the strobe signal, one of the redundancy address signal or the normal address signal as the target address signal for outputting. All of the above transformations shall fall within the scope of protection of the disclosure.

It should be understood that with the first AND gate 401, the first inverter 402, the second AND gate 403, the NOR gate 404 and the second inverter 405, one of the redundancy address signal or the normal address signal may be selected, based on the level state of the strobe signal, as the target address signal for outputting, so that refresh of the redundancy address signal and refresh of the normal address signal may be completed within the refresh cycle including the first pulse duration and the second pulse duration, respectively, thereby saving consumption and improving performance.

Figure 6:
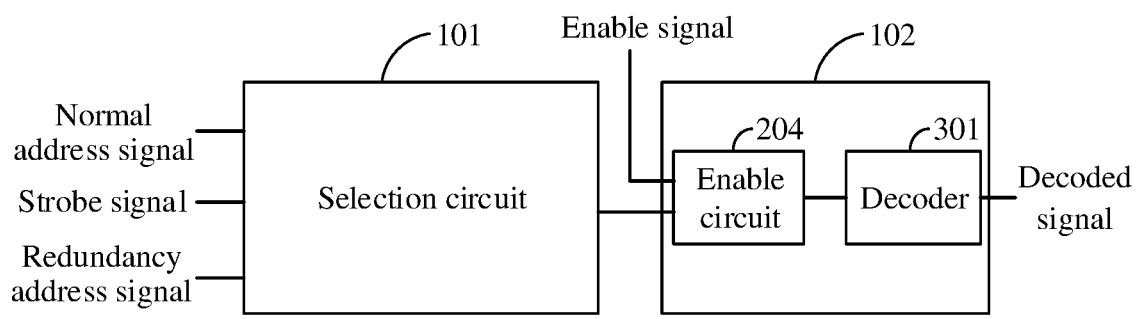
FIG. 6 is a fifth schematic structural diagram of an address refresh circuit according to an embodiment of the disclosure.

In some embodiments of the disclosure, as shown in FIG. 6, the decoding circuit 102 includes an enable circuit 204 and a decoder 301. The enable circuit 204 is connected to an output terminal of the selection circuit 101, and is configured to receive an enable signal and output, in response to the enable signal being at a second level, the received target address signal. The decoder 301 is connected to an output terminal of the enable circuit 204, and is configured to decode the target address signal to obtain and output the decoded signal.

In the embodiment of the disclosure, the enable circuit 204 has a first input terminal connected to the output terminal of the selection circuit 101 to receive the target address signal, and a second input terminal for receiving the enable signal, and the enable circuit 204 is configured to output the received target address signal in response to the enable signal being at the second level. That is, the enable circuit 204 may control the output of the target address signal based on the level of the enable signal.

In the embodiment of the disclosure, the decoded signal output by the decoder 301 may characterize position information of a row address to be refreshed. A refresh module may determine and refresh a corresponding row address based on the decoded signal. The refresh module may be implemented one or more hardware circuits/sub-circuits and/or one or more processors. In some examples, a module may include one or more circuits with or without stored code or instructions. The module may include one or more components that are directly or indirectly connected. These components may or may not be physically attached to, or located adjacent to, one another.

It should be understood that the enable circuit 204 may control the output of the target address signal based on the level of the enable signal. Therefore, timing of the target address signal may be adjusted to improve timing state of the signal.

Figure 7:
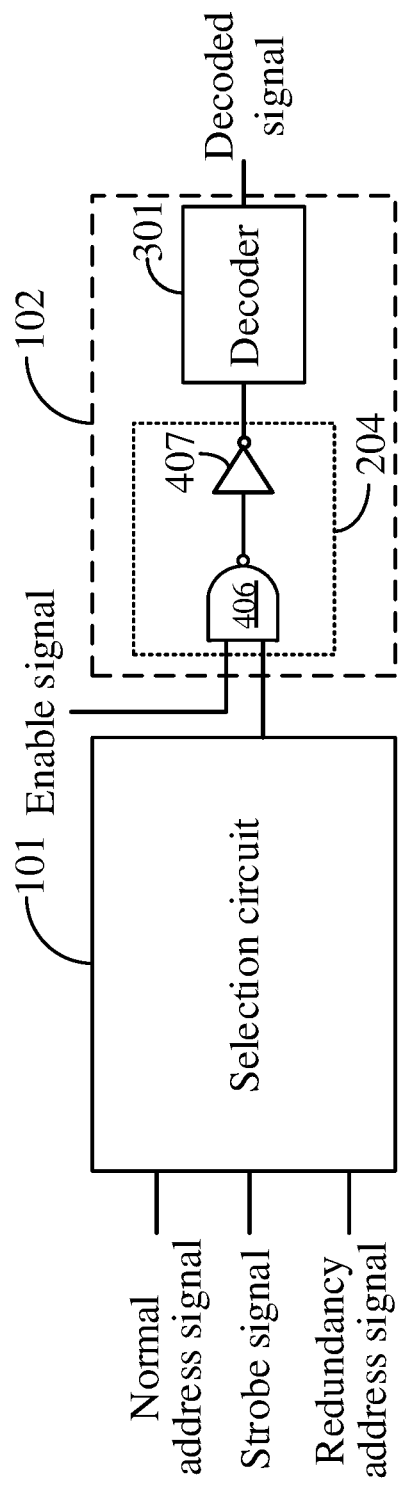
FIG. 7 is a sixth schematic structural diagram of an address refresh circuit according to an embodiment of the disclosure.

In some embodiments of the disclosure, as shown in FIG. 7, the enable circuit 204 includes a NAND gate 406 and a third inverter 407. The NAND gate 406 has a first input terminal, which is taken as the first input terminal of the enable circuit 204, for receiving the enable signal, a second input terminal taken as the second input terminal of the enable circuit 204 and connected to the output terminal of the selection circuit 101, and an output terminal connected to an input terminal of the third inverter 407. The third inverter 407 has an output terminal taken as the output terminal of the enable circuit 204 and connected to the decoder 301.

In the embodiment of the disclosure, the input terminals of the NAND gate 406 are configured to receive the enable signal and the target address signal, and the second level of the enable signal is a high level, i.e., logical 1. The NAND gate 406 and the third inverter 407 are configured to perform an AND operation on the enable signal and the target address signal. If the enable signal is at the second level, i.e., logical 1, the third inverter 407 is configured to output the target address signal subjected to the AND operation; and if the enable signal is at logical 0, the third inverter 407 is configured to output logical 0, that is, the target address signal is masked.

In the embodiment of the disclosure, the third inverter 407 may drive the output target address signal, to reduce attenuation of the target address signal during transmission.

It should be noted that the NAND gate 406 may be replaced with a NOR gate. After such replacement, the received target address signal is output when the enable signal is at logical 0. Therefore, the output of the target address signal may be controlled based on the level of the enable signal. Correspondingly, subsequent circuits may identify the target address signal. If the target address signal is always at logical 1, the target address signal is determined as an invalid signal, and the address refresh operation is not performed. All of the above transformations shall fall within the scope of protection of the disclosure.

It should be understood that the NAND gate 406 and the third inverter 407 may perform an AND operation on the enable signal and the target address signal, output the target address signal when the enable signal is at logical 1, and masks the target address signal when the enable signal is at logical 0. Therefore, it is achieved that the output of the target address signal is controlled based on the level of the enable signal, so that timing of the target address signal may be adjusted to improve timing state of the signal.

Figure 8:
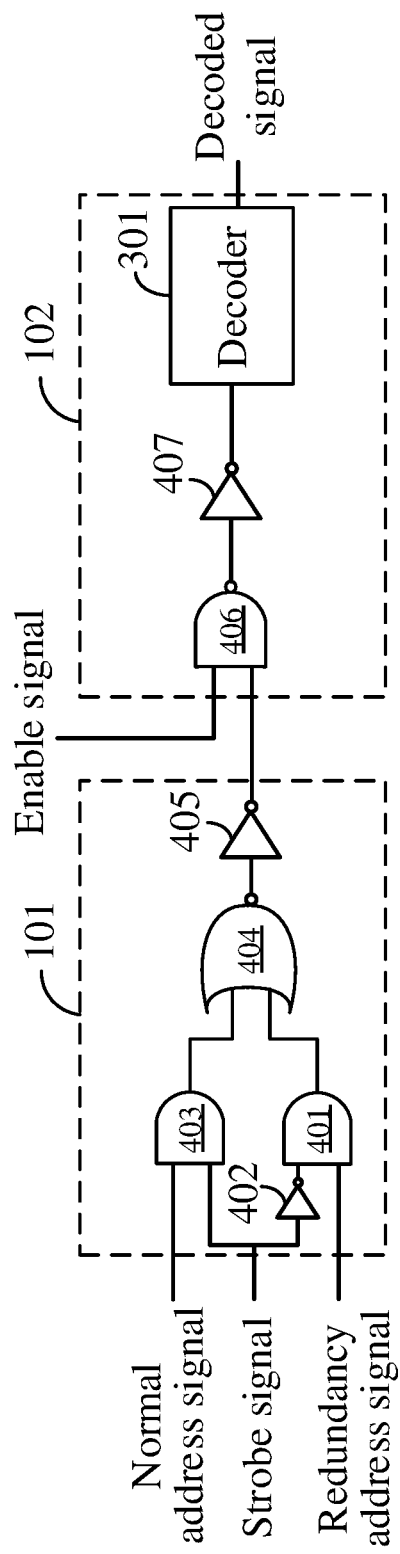
FIG. 8 is a seventh schematic structural diagram of an address refresh circuit according to an embodiment of the disclosure.

In some embodiments of the disclosure, as shown in FIG. 8, the second inverter 405 has the output terminal taken as the output terminal of the selection circuit 101 and connected to the second input terminal of the NAND gate 406.

In the embodiment of the disclosure, the first AND gate 401 has the input terminals for receiving an inverted signal of the strobe signal and the redundancy address signal, the second AND gate 403 is configured to receive the normal address signal and the strobe signal, and the output terminal of the first AND gate 401 and the output terminal of the second AND gate 403 are connected to two input terminals of the NOR gate 404, respectively. When the strobe signal is at logical 0, the second inverter 405 is configured to output, to the first input terminal of the NAND gate 406, the redundancy address signal as the target address signal; and when the strobe signal is at logical 1, the second inverter 405 is configured to output, to the first input terminal of the NAND gate 406, the normal address signal as the target address signal. Therefore, during each pulse duration within a refresh cycle, refresh of RedRa or refresh of Ra may be achieved by controlling the level of the strobe signal.

The first input terminal of the NAND gate 406 is configured to receive the target address signal, and the second input terminal of the NAND gate 406 is configured to receive the enable signal. When the enable signal is at logical 1, the third inverter 407 is configured to output the target address signal to the decoder 301 for decoding. Therefore, timing of the target address signal may be adjusted based on the enable signal, to improve timing state of the signal.

Figure 9:
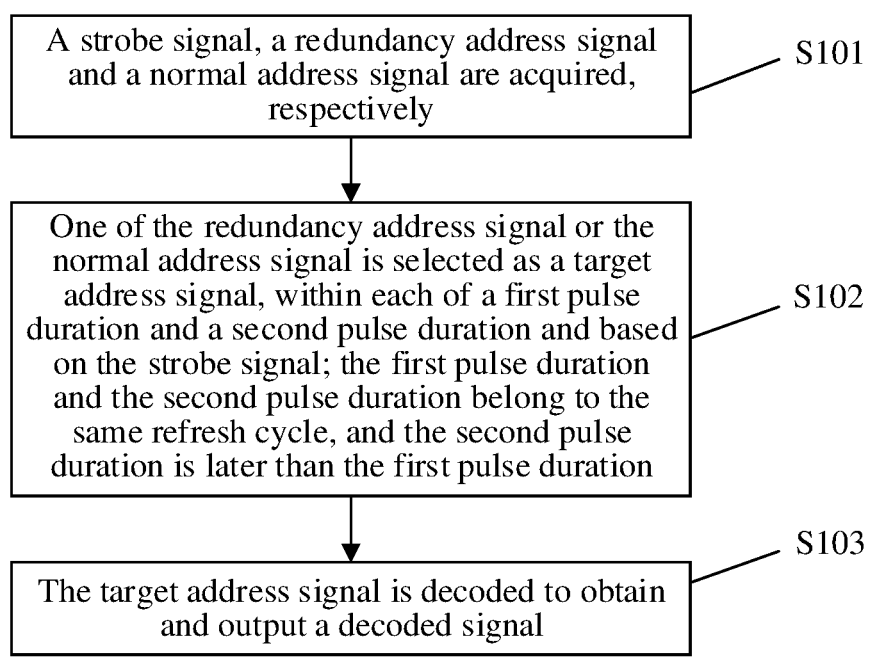
FIG. 9 is a first flowchart of an address refresh method according to an embodiment of the disclosure.

FIG. 9 is an optional schematic flowchart of an address refresh method according to an embodiment of the disclosure, which will be described with reference to operations shown in FIG. 9.

In operation S101, a strobe signal, a redundancy address signal and a normal address signal are acquired, respectively.

In the embodiment of the disclosure, the selection circuit 101 may be configured to acquire the strobe signal, the redundancy address signal and the normal address signal, respectively. The redundancy address signal may correspond to a redundancy row address (referred to as RedRa), and the normal address signal may correspond to a normal row address (referred to as Ra).

In operation S102, one of the redundancy address signal or the normal address signal is selected as a target address signal, within each of a first pulse duration and a second pulse duration and based on the strobe signal; the first pulse duration and the second pulse duration belong to the same refresh cycle, and the second pulse duration is later than the first pulse duration.

In the embodiment of the disclosure, the pulse duration characterizes a refresh state and address refresh may be performed once correspondingly within the pulse duration. That is, the selection circuit 101 may be configured to refresh one of RedRa or Ra within each of the first pulse duration and the second pulse duration. Therefore, refresh of the redundancy address signal and refresh of the normal address signal may be completed within a refresh cycle, respectively.

In operation S103, the target address signal is decoded to obtain and output a decoded signal.

In the embodiment of the disclosure, the decoding circuit 102 may be configured to decode the target address signal, to obtain and output the decoded signal. The decoded signal characterizes position information of a row address to be refreshed. A corresponding row address may be determined and refreshed based on the decoded signal.

It should be understood that according to the embodiment of the disclosure, within each of the first pulse duration and the second pulse duration and based on the strobe signal, one of the redundancy address signal or the normal address signal may be selected as the target address signal for decoding. The first pulse duration and the second pulse duration belong to the same refresh cycle, and address refresh may be performed once within each pulse duration, therefore, according to the embodiment of the disclosure, refresh of Ra and refresh of RedRa may be completed within the same refresh cycle, that is, refresh of two types of row addresses may be completed through a set of circuits, thereby saving consumption and improving performance.

In some embodiments of the disclosure, the operation S103 shown in FIG. 9 may be implemented by an operation S1031, which will be described with reference to the following operation.

In operation S1031, if an acquired enable signal is at a second level, the target address signal is decoded to obtain and output the decoded signal.

In the embodiment of the disclosure, the enable circuit 204 may be configured to control the output of the target address signal based on the level of the enable signal. Referring to FIG. 6, the second input terminal of the enable circuit 204 is configured to receive the enable signal, and if the enable signal is at the second level, the enable circuit 204 is configured to output the received target address signal to the decoder 301; and the decoder 301 is configured to decode the target address signal and outputs the decoded signal.

It should be understood that the output of the target address signal is controlled based on the level of the enable signal. Therefore, timing of the target address signal may be adjusted to improve timing state of the signal.

In some embodiments of the disclosure, the refresh cycle may further include a third pulse duration; and an operation S104 is further included after the operation S101 shown in FIG. 9, which will be described with reference to the following operation.

In operation S104, one of the redundancy address signal or the normal address signal is selected as the target address signal, within the third pulse duration and based on the strobe signal.

In the embodiment of the disclosure, the refresh cycle may further include more pulse durations (e.g., the third pulse duration). Correspondingly, the selection circuit 101 may be configured to select one of the redundancy address signal or the normal address signal as the target address signal, within the third pulse duration and based on the strobe signal.

It should be understood that according to the embodiment of the disclosure, more than two pulse durations may be included within a refresh cycle, and a corresponding refresh mode is referred to as multi-pulse refresh.

Figure 10:
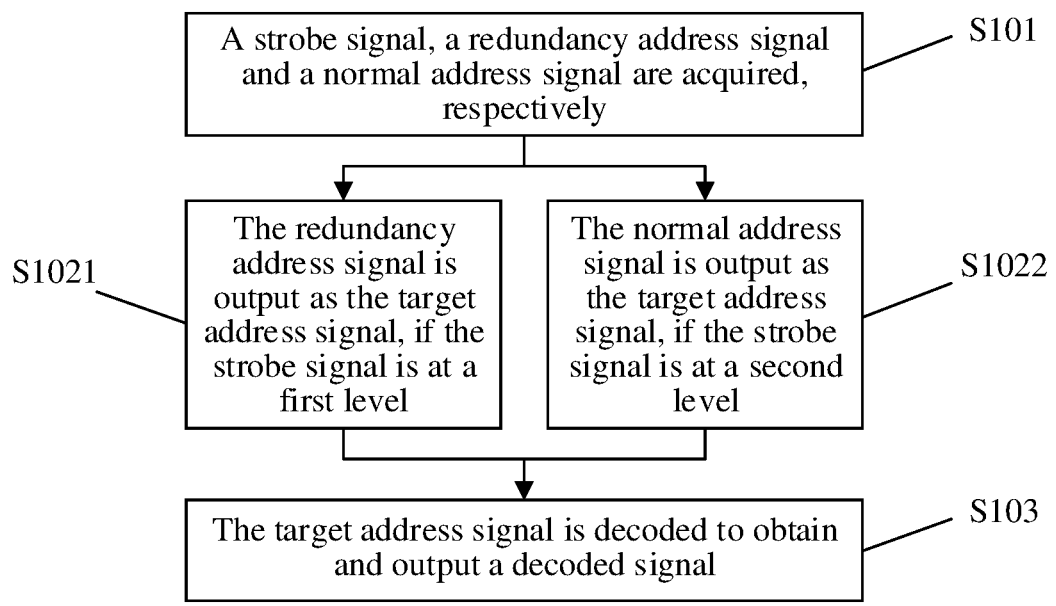
FIG. 10 is a second flowchart of an address refresh method according to an embodiment of the disclosure.

In some embodiments of the disclosure, the operation S102 shown in FIG. 9 may be implemented by operations S1021~S1022 shown in FIG. 10, which will be described with reference to the following operations.

In operation S1021, the redundancy address signal is output as the target address signal, if the strobe signal is at a first level.

In the embodiment of the disclosure, the selection circuit 101 may be configured to output the redundancy address signal as the target address signal, when the strobe signal is at the first level.

In operation S1022, the normal address signal is output as the target address signal, if the strobe signal is at a second level.

In the embodiment of the disclosure, the selection circuit 101 may be configured to output the normal address signal as the target address signal, when the strobe signal is at the second level.

It should be noted that each of the first level and the second level is a high level or a low level. The selection circuit 101 may be configured to implement, through an AND gate or an OR gate, the process of selecting the target address signal based on the level state of the strobe signal, which is not limited here.

It should be understood that a corresponding address signal is output based on the level state of the strobe signal. Therefore, one of the redundancy address signal or the normal address signal may be output within each pulse duration to complete refresh, so that refresh of the redundancy address signal and refresh of the normal address signal may be completed within the refresh cycle including the first pulse duration and the second pulse duration, respectively, thereby saving consumption and improving performance.

Figure 11:
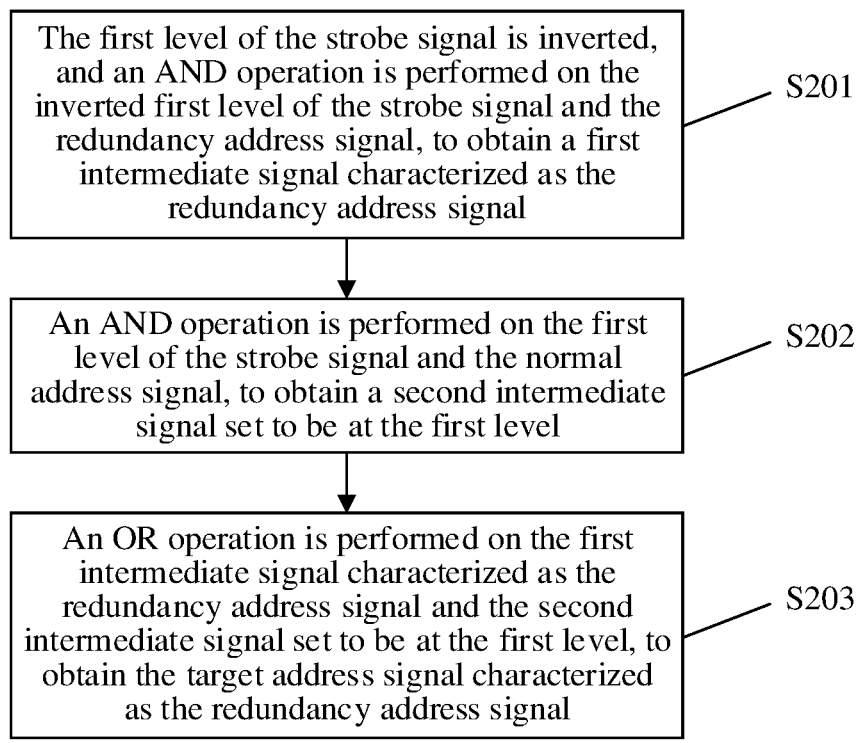
FIG. 11 is a third flowchart of an address refresh method according to an embodiment of the disclosure.

In some embodiments of the disclosure, the first level characterizes logical 0; and the operation S1021 shown in FIG. 10 may be implemented by operations S201~S203 shown in FIG. 11, which will be described with reference to the following operations.

In operation S201, the first level of the strobe signal is inverted, and an AND operation is performed on the inverted first level of the strobe signal and the redundancy address signal, to obtain a first intermediate signal characterized as the redundancy address signal.

In the embodiment of the disclosure, referring to FIG. 5, the selection circuit 101 may be configured to invert logical 0 of the strobe signal into logical 1 through the first inverter 402; and configured to perform the AND operation on logical 1 and the redundancy address signal through the first AND gate 401, to obtain the first intermediate signal 'a' characterized as the redundancy address signal.

In operation S202, an AND operation is performed on the first level of the strobe signal and the normal address signal, to obtain a second intermediate signal set to be at the first level.

In the embodiment of the disclosure, referring to FIG. 5, the selection circuit 101 may be configured to perform the AND operation on logical 0 of the strobe signal and the normal address signal through the second AND gate 403, to obtain the second intermediate signal 'b' set to logical 0, that is, to mask the normal address signal.

In operation S203, an OR operation is performed on the first intermediate signal characterized as the redundancy address signal and the second intermediate signal set to be at the first level, to obtain the target address signal characterized as the redundancy address signal.

In the embodiment of the disclosure, referring to FIG. 5, the selection circuit 101 may be configured to perform the OR operation on the first intermediate signal 'a' and the second intermediate signal 'b' through the NOR gate 404 and the second inverter 405, to obtain and output the redundancy address signal as the target address signal.

Figure 12:
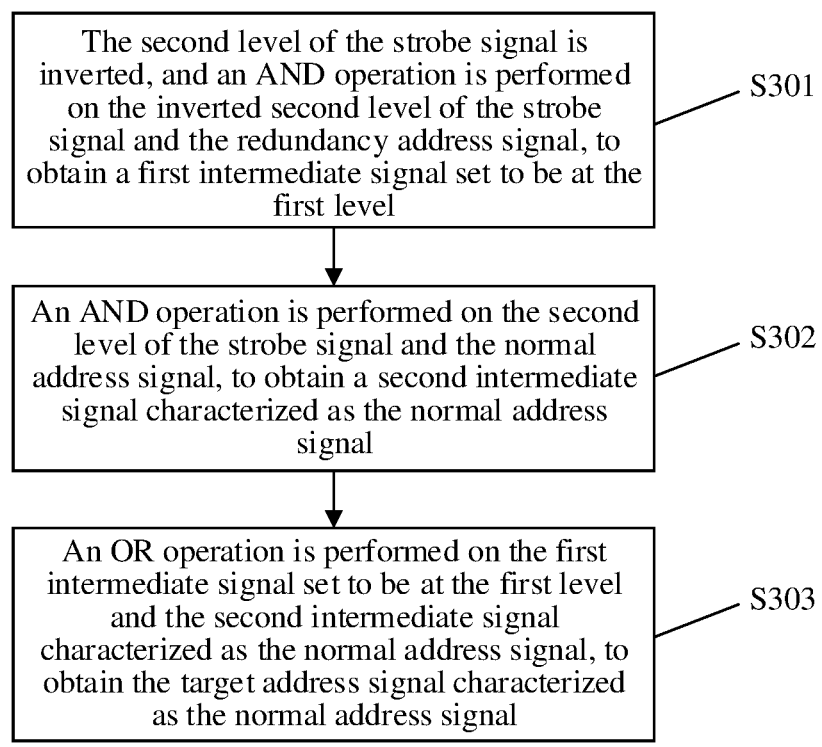
FIG. 12 is a fourth flowchart of an address refresh method according to an embodiment of the disclosure.

In some embodiments of the disclosure, the second level characterizes logical 1; and the operation S1022 shown in FIG. 10 may be implemented by operations S301~S303 shown in FIG. 12, which will be described with reference to the following operations.

In operation S301, the second level of the strobe signal is inverted, and an AND operation is performed on the inverted second level of the strobe signal and the redundancy address signal, to obtain a first intermediate signal set to be at the first level.

In the embodiment of the disclosure, referring to FIG. 5, the selection circuit 101 may be configured to invert logical 1 of the strobe signal into logical 0 through the first inverter 402; and configured to perform the AND operation on logical 0 and the redundancy address signal through the first AND gate 401, to obtain the first intermediate signal 'a' set to logical 0, that is, to mask the redundancy address signal.

In operation S302, an AND operation is performed on the second level of the strobe signal and the normal address signal, to obtain a second intermediate signal characterized as the normal address signal.

In the embodiment of the disclosure, referring to FIG. 5, the selection circuit 101 may be configured to perform the AND operation on logical 1 of the strobe signal and the normal address signal through the second AND gate 403, to obtain the second intermediate signal 'b' characterized as the normal address signal.

In operation S303, an OR operation is performed on the first intermediate signal set to be at the first level and the second intermediate signal characterized as the normal address signal, to obtain the target address signal characterized as the normal address signal.

In the embodiment of the disclosure, referring to FIG. 5, the selection circuit 101 may be configured to perform the OR operation on the first intermediate signal 'a' and the second intermediate signal 'b' through the NOR gate 404 and the second inverter 405, to obtain and output the normal address signal as the target address signal.

It should be understood that with the first AND gate 401, the first inverter 402, the second AND gate 403, the NOR gate 404 and the second inverter 405, one of the redundancy address signal or the normal address signal may be selected, based on level state of the strobe signal, as the target address signal for outputting, so that refresh of the redundancy address signal and refresh of the normal address signal may be completed within the refresh period including the first pulse duration and the second pulse duration, respectively, thereby saving consumption and improving performance.

Figure 13:
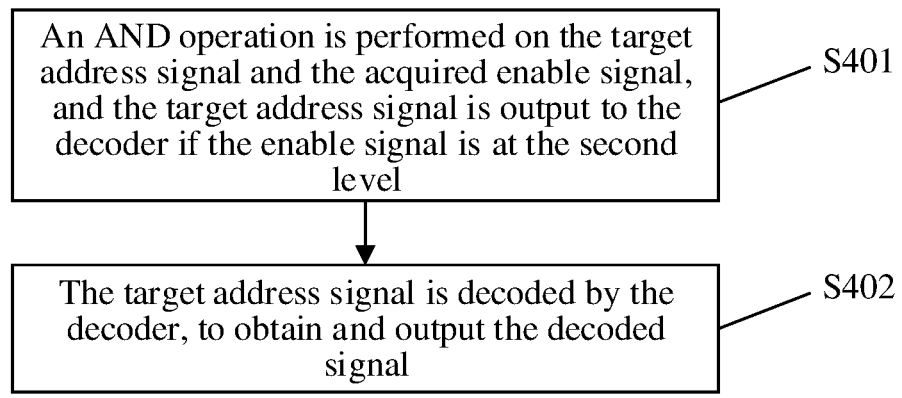
FIG. 13 is a fifth flowchart of an address refresh method according to an embodiment of the disclosure.

In some embodiments of the disclosure, the second level characterizes logical 1; and the operation S1031 in the above-described embodiment may be implemented by operations S401~S402 shown in FIG. 13, which will be described with reference to the following operations.

In operation S401, an AND operation is performed on the target address signal and the acquired enable signal, and the target address signal is output to the decoder if the enable signal is at the second level.

In the embodiment of the disclosure, referring to FIG. 7, when the enable signal is at logical 1, the enable circuit 204 may be configured to perform the AND operation on the enable signal and the target address signal through the NAND gate 406 and the third inverter 407. If the enable signal is at the second level, i.e., logical 1, the third inverter 407 is configured to output the target address signal subjected to the AND operation; and if the enable signal is at logical 0, the third inverter 407 is configured to output logical 0, that is, the target address signal is masked.

In operation S402, the target address signal is decoded by the decoder, to obtain and output the decoded signal.

In the embodiment of the disclosure, the decoder 301 may be configured to decode the target address signal, to obtain and output the decode signal.

It should be understood that the AND operation is performed on the enable signal and the target address signal through the NAND gate 406 and the third inverter 407. In this way, the target address signal is output when the enable signal is at logical 1, and the target address signal is masked when the enable signal is at logical 0. Therefore, it is achieved that the output of the target address signal is controlled based on the level of the enable signal, so that timing of the target address signal may be adjusted to improve timing state of the signal.

Figure 14:
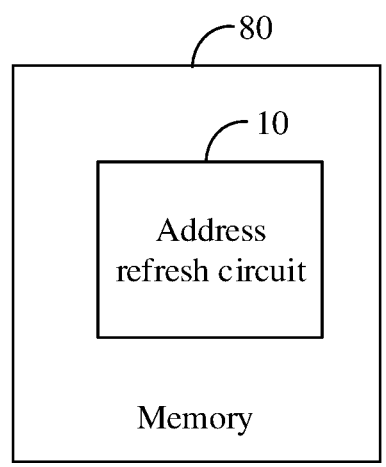
FIG. 14 is a schematic structural diagram of a memory according to an embodiment of the disclosure.

An embodiment of the disclosure further provides a memory 80. As shown in FIG. 14, the memory 80 includes the address refresh circuit 10 in the foregoing embodiments, so that consumption may be saved and performance may be improved.

In some embodiments of the disclosure, the memory 80 shown in FIG. 14 includes at least a DRAM.

Figure 15:
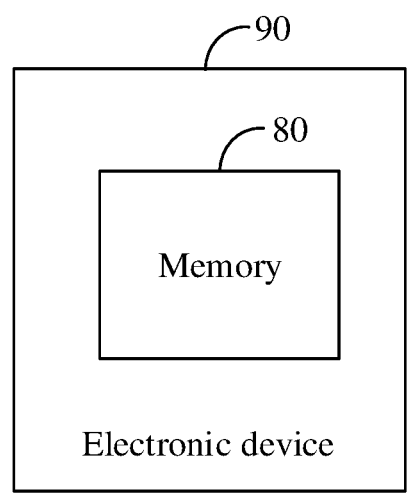
FIG. 15 is a schematic structural diagram of an electronic device according to an embodiment of the disclosure.

An embodiment of the disclosure further provides an electronic device 90. As shown in FIG. 15, the electronic device 90 includes the memory 80.

It should be noted that in the disclosure, the terms "include", "including" or any other variation thereof are intended to cover non-exclusive inclusion, such that a process, method, article, or device including a series of elements includes not only those elements but also other elements that are not listed explicitly, or elements inherent to such process, method, article, or device. Without any more limitation, an element defined by a sentence "include a . . . " does not exclude other identical elements existing in a process, method, article, or device including the element.

The above serial numbers for embodiments of the disclosure are for the purpose of description only and do not represent pros and cons of the embodiments. The methods disclosed in several method embodiments provided by the disclosure may be combined arbitrarily without conflict, to obtain new method embodiments. The features disclosed in several product embodiments provided by the disclosure may be combined arbitrarily without conflict, to obtain new product embodiments. The features disclosed in several method or device embodiments provided by the disclosure may be combined arbitrarily without conflict, to obtain new method or device embodiments.

The above descriptions are merely specific embodiments of the disclosure. However, the scope of protection of the disclosure is not limited thereto. Any variation or replacement readily conceivable by any person skilled in the art within the technical scope of the disclosure shall fall within the scope of protection of the disclosure. Therefore, the scope of protection of the disclosure is subjected to the scope of protection of the claims.

INDUSTRIAL APPLICABILITY

The address refresh circuit provided by the embodiments of the disclosure may complete refresh of the normal row address and refresh of redundancy row address within a refresh cycle, that is, refresh of two types of row addresses may be completed through a set of circuits, thereby saving consumption and improving performance.

The invention claimed is:

1. An address refresh circuit, comprising:
a selection circuit, configured to acquire a strobe signal, a redundancy address signal and a normal address signal; and select, within each of a first pulse duration and a second pulse duration and based on the strobe signal, one of the redundancy address signal or the normal address signal as a target address signal; wherein the first pulse duration and the second pulse duration belong to a same refresh cycle, and the second pulse duration is later than the first pulse duration; and
a decoding circuit, configured to decode the target address signal to obtain and output a decoded signal.

2. The address refresh circuit of claim 1, wherein the selection circuit comprises:
a first selection circuit, configured to receive the redundancy address signal and the strobe signal, and output, in response to the strobe signal being at a first level, the redundancy address signal; and
a second selection circuit, configured to receive the normal address signal and the strobe signal, and output, in response to the strobe signal being at a second level, the normal address signal.

3. The address refresh circuit of claim 2, wherein the first selection circuit comprises a first AND gate and a first inverter, the first AND gate has a first input terminal connected to an output terminal of the first inverter and has a second input terminal for receiving the redundancy address signal, and the first inverter has an input terminal for receiving the strobe signal;
the second selection circuit comprises a second AND gate configured to receive the normal address signal and the strobe signal; and
the selection circuit further comprises: a third selection circuit, which has input terminals connected to an output terminal of the first AND gate and an output terminal of the second AND gate, respectively, and has an output terminal connected to an input terminal of the decoding circuit.

4. The address refresh circuit of claim 3, wherein the third selection circuit comprises:
a NOT-OR (NOR) gate, which has an output terminal connected to an input terminal of a second inverter, and has input terminals taken as the input terminals of the third selection circuit; and
the second inverter, which has an output terminal taken as the output terminal of the third selection circuit.

5. The address refresh circuit according to claim 1, wherein the decoding circuit comprises:
an enable circuit, connected to an output terminal of the selection circuit, and configured to receive an enable signal and output, in response to the enable signal being at a second level, the target address signal; and
a decoder, connected to an output terminal of the enable circuit, and configured to decode the target address signal to obtain and output the decoded signal.

6. The address refresh circuit of claim 5, wherein the enable circuit comprises:
a NOT-AND (NAND) gate, which has a first input terminal, which is taken as a first input terminal of the enable circuit, for receiving the enable signal, has a second input terminal taken as a second input terminal of the enable circuit and connected to the output terminal of the selection circuit, and has an output terminal connected to an input terminal of a third inverter; and
the third inverter, which has an output terminal taken as the output terminal of the enable circuit and connected to the decoder.

7. The address refresh circuit of claim 1, wherein the refresh cycle further comprises a third pulse duration, and
the selection circuit is further configured to select, within the third pulse duration and based on the strobe signal, one of the redundancy address signal or the normal address signal as the target address signal.

8. An address refresh method, comprising:
acquiring a strobe signal, a redundancy address signal and a normal address signal, respectively;
selecting, within each of a first pulse duration and a second pulse duration and based on the strobe signal, one of the redundancy address signal or the normal address signal as a target address signal; wherein the first pulse duration and the second pulse duration belong to a same refresh cycle, and the second pulse duration is later than the first pulse duration; and
decoding the target address signal to obtain and output a decoded signal.

9. The address refresh method of claim 8, wherein decoding the target address signal to obtain and output the decoded signal comprises:
decoding, in response to an acquired enable signal being at a second level, the target address signal to obtain and output the decoded signal.

10. The address refresh method of claim 8, wherein the refresh cycle further comprises a third pulse duration; and the method further comprises:
selecting, within the third pulse duration and based on the strobe signal, one of the redundancy address signal or the normal address signal as the target address signal.

11. The address refresh method of claim 8, wherein selecting, based on the strobe signal, one of the redundancy address signal or the normal address signal as the target address signal comprises:
outputting, in response to the strobe signal being at a first level, the redundancy address signal as the target address signal; or
outputting, in response to the strobe signal being at a second level, the normal address signal as the target address signal.

12. The address refresh method of claim 11, wherein the first level characterizes logical 0; and outputting, in response to the strobe signal being at the first level, the redundancy address signal as the target address signal comprises:

inverting the first level of the strobe signal, and performing an AND operation on the inverted first level of the strobe signal and the redundancy address signal, to obtain a first intermediate signal characterized as the redundancy address signal;

performing an AND operation on the first level of the strobe signal and the normal address signal, to obtain a second intermediate signal set to be at the first level; and performing an OR operation on the first intermediate signal characterized as the redundancy address signal and the second intermediate signal set to be at the first level, to obtain the target address signal characterized as the redundancy address signal.

13. The address refresh method of claim 11, wherein the second level characterizes logical 1; and outputting, in response to the strobe signal being at the second level, the normal address signal as the target address signal comprises:

inverting the second level of the strobe signal, and performing an AND operation on the inverted second level of the strobe signal and the redundancy address signal, to obtain a first intermediate signal set to be at a first level;

performing an AND operation on the second level of the strobe signal and the normal address signal, to obtain a second intermediate signal characterized as the normal address signal; and performing an OR operation on the first intermediate signal set to be at the first level and the second intermediate signal characterized as the normal address signal, to obtain the target address signal characterized as the normal address signal.

14. The address refresh method of claim 9, wherein the second level characterizes logical 1; and decoding, in response to the acquired enable signal being at the second level, the target address signal to obtain and output the decoded signal comprises:

performing an AND operation on the target address signal and the acquired enable signal, and outputting, in response to the acquired enable signal being at the second level, the target address signal to a decoder; and decoding, by the decoder, the target address signal to obtain and output the decoded signal.

15. A memory comprising the address refresh circuit of claim 1.

16. The memory of claim 15, wherein the memory comprises at least a dynamic random access memory (DRAM).

17. An electronic device comprising the memory of claim 15.

* * * * *